US009070580B2

United States Patent
Willmeroth et al.

(10) Patent No.: US 9,070,580 B2
(45) Date of Patent: Jun. 30, 2015

(54) SEMICONDUCTOR DEVICE WITH A SUPER JUNCTION STRUCTURE BASED ON A COMPENSATION STRUCTURE WITH COMPENSATION LAYERS AND HAVING A COMPENSATION RATE GRADIENT

(71) Applicant: Infineon Technologies Austria AG, Villach (AT)

(72) Inventors: Armin Willmeroth, Augsburg (DE); Markus Schmitt, Neubiberg (DE); Winfried Kaindl, Unterhaching (DE); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/874,895

(22) Filed: May 1, 2013

(65) Prior Publication Data
US 2014/0327069 A1 Nov. 6, 2014

(51) Int. Cl.
*H01L 29/66* (2006.01)
*H01L 29/10* (2006.01)
(Continued)

(52) U.S. Cl.
CPC ........... *H01L 29/105* (2013.01); *H01L 29/063* (2013.01); *H01L 29/7827* (2013.01)

(58) Field of Classification Search
CPC . H01L 29/105; H01L 29/7827; H01L 29/063; H01L 29/0834
USPC ......... 257/486, 492, 287, 401, 341, 241, 342, 257/330, E21.417
See application file for complete search history.

(56) References Cited

U.S. PATENT DOCUMENTS

| 6,630,698 B1 | 10/2003 | Deboy et al. |
| 7,892,924 B1 | 2/2011 | Lee et al. |
| 8,421,152 B2 | 4/2013 | Sasaki |

(Continued)

FOREIGN PATENT DOCUMENTS

| DE | 10057612 A1 | 5/2002 |
| DE | 102004037153 A1 | 3/2006 |

(Continued)

OTHER PUBLICATIONS

Moens at al. UltiMOS: A Local Charge-Balanced Trench-Based 600V Super-Junction Device. Proceeding of the 23 International Symposium on Power Semiconductor Devices & Ic's May 23-26, 2011, San Diego, CA.*

(Continued)

*Primary Examiner* — Galina Yushina
(74) *Attorney, Agent, or Firm* — Murphy, Bilak & Homiller, PLLC

(57) ABSTRACT

A super junction structure is formed in a semiconductor portion of a super junction semiconductor device. The super junction structure includes a compensation structure with a first compensation layer of a first conductivity type and a second compensation layer of a complementary second conductivity type. The compensation structure lines at least sidewall portions of compensation trenches that extend between semiconductor mesas along a vertical direction perpendicular to a first surface of the semiconductor portion. Within the super junction structure and a pedestal layer that may adjoin the super junction structure, a sign of a lateral compensation rate changes along the vertical direction resulting in a local peak of a vertical electric field gradient and to improved avalanche ruggedness.

12 Claims, 16 Drawing Sheets

(51) Int. Cl.
*H01L 29/06* (2006.01)
*H01L 29/78* (2006.01)

(56) References Cited

U.S. PATENT DOCUMENTS

| | | | |
|---|---|---|---|
| 8,455,956 B2 | 6/2013 | Saggio et al. | |
| 2003/0232477 A1 | 12/2003 | Deboy et al. | |
| 2004/0007736 A1* | 1/2004 | Deboy et al. | 257/328 |
| 2008/0111207 A1 | 5/2008 | Lee et al. | |
| 2008/0246079 A1* | 10/2008 | Saito et al. | 257/328 |
| 2010/0059814 A1* | 3/2010 | Loechelt et al. | 257/330 |
| 2010/0163846 A1 | 7/2010 | Yilmaz et al. | |
| 2011/0101446 A1 | 5/2011 | Guan et al. | |
| 2011/0140167 A1* | 6/2011 | Yilmaz et al. | 257/139 |
| 2011/0220992 A1 | 9/2011 | Inomata | |
| 2014/0231903 A1* | 8/2014 | Willmeroth et al. | 257/330 |

FOREIGN PATENT DOCUMENTS

| | | |
|---|---|---|
| DE | 102007030755 B3 | 2/2009 |
| JP | 2007251023 A | 9/2007 |
| WO | 0038242 A1 | 6/2000 |

OTHER PUBLICATIONS

Moens et al. "UltiMOS : A Local Charge-Balanced Trench-Based 600V Super-Junction Device." IEEE Proceedings of the 23rd International Symposium on Power Semiconductor Devices and ICs. May 23-26, 2011. San Diego, CA. pp. 304-307.

Vanmeerbeek et al. "Enhancing the robustness of a multiple floating field-limiting ring termination by introducing a buffer layer." IEEE Proceedings of the 2012 24th International Symposium on Power Semiconductor Devices and ICs. Jun. 3-7, 2012. Bruges, Belgium. pp. 357-360.

Seto et al. "Universal Trench Edge Termination Design." IEEE Proceedings of the 2012 24th International Symposium on Power Semiconductor Devices and ICs. Jun. 3-7, 2012. Bruges, Belgium. pp. 161-164.

Kambiba et al. "Design of Trench Termination for High Voltage Devices." IEEE Proceedings of the 22nd International Symposium on Power Semicondutor Devices and ICs. Jun. 6-10, 2010. pp. 107-110.

Schmidt, Gerhard et al. "Vertical Edge Termination with Drain-Sided Field Plate." 2005. pp. 1-7. Simens AG.

* cited by examiner

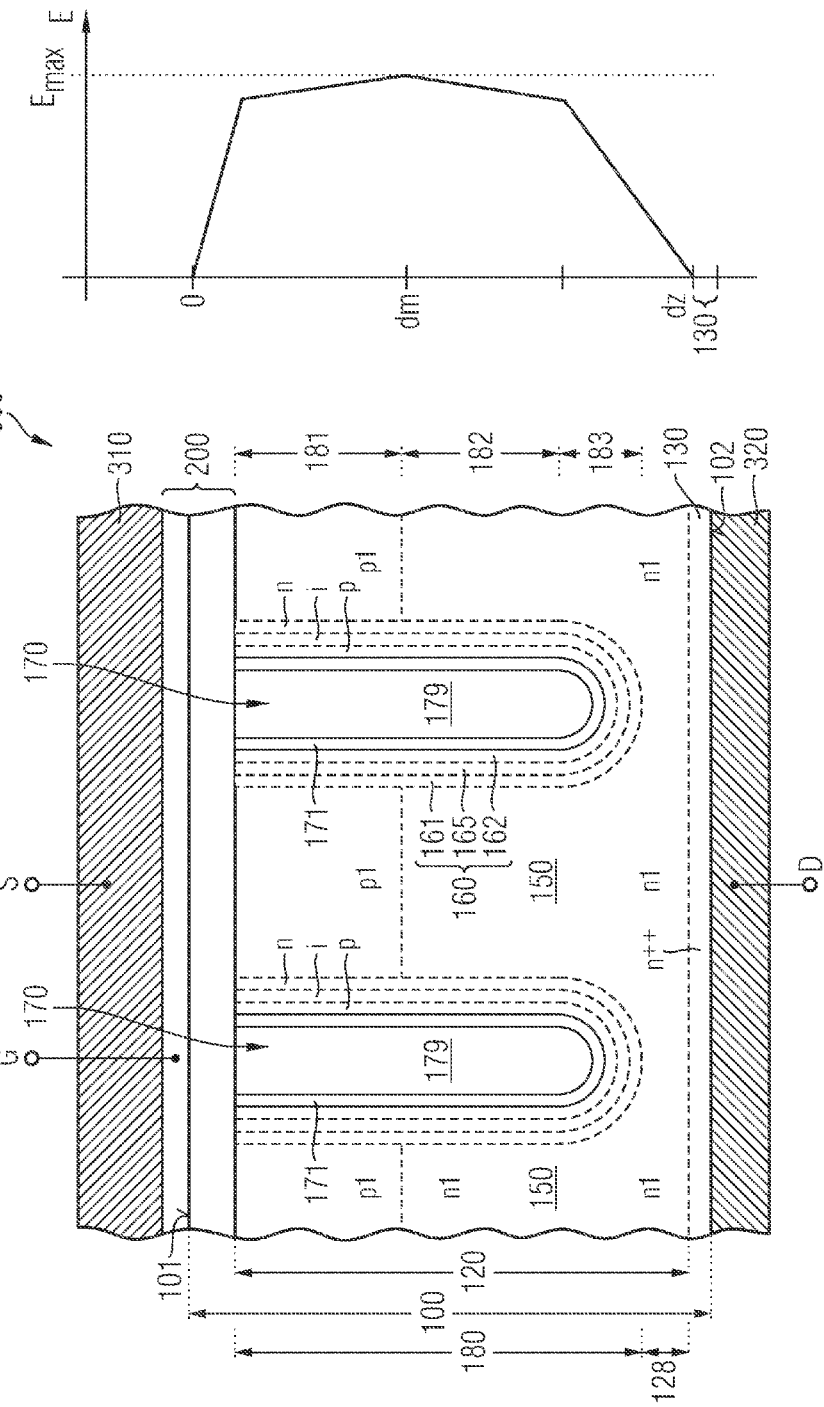

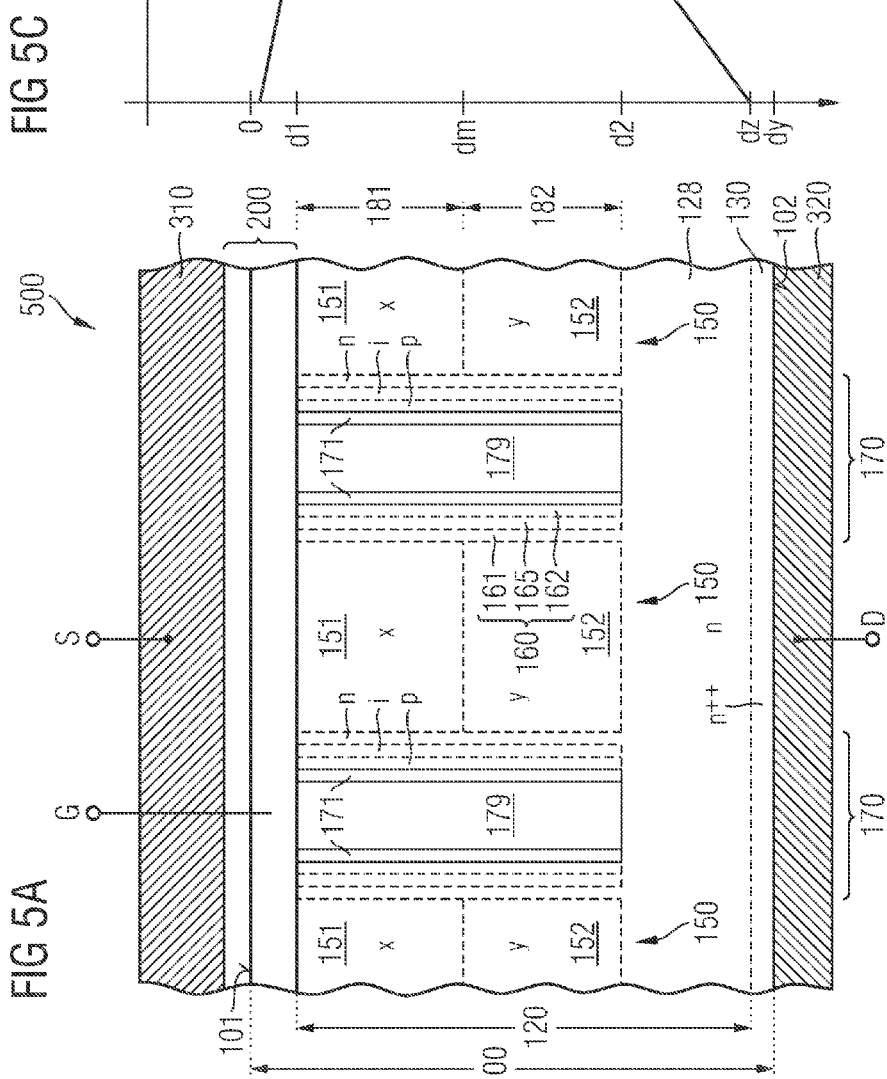

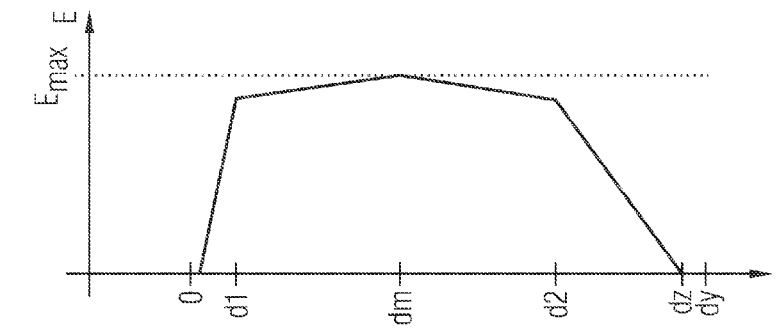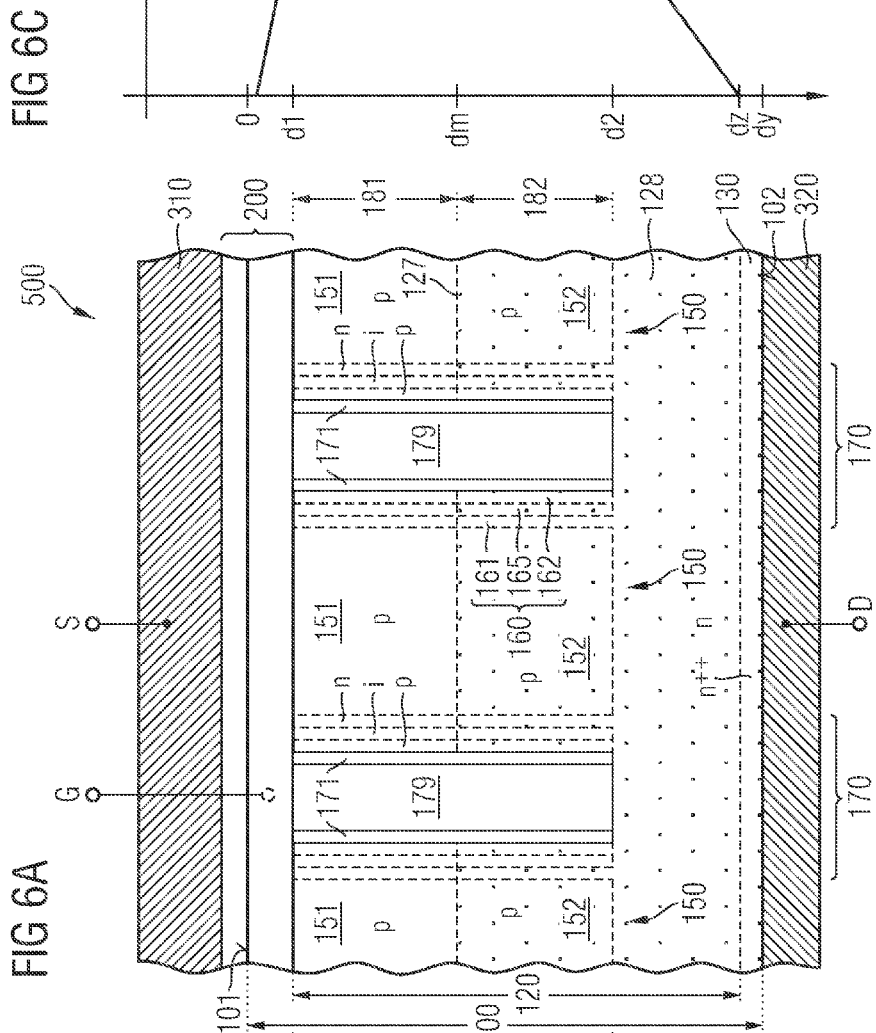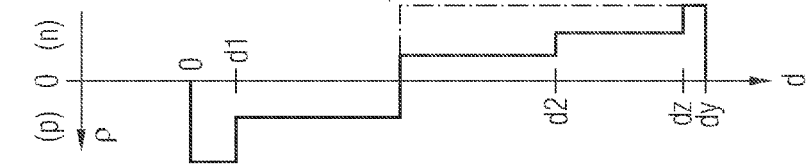

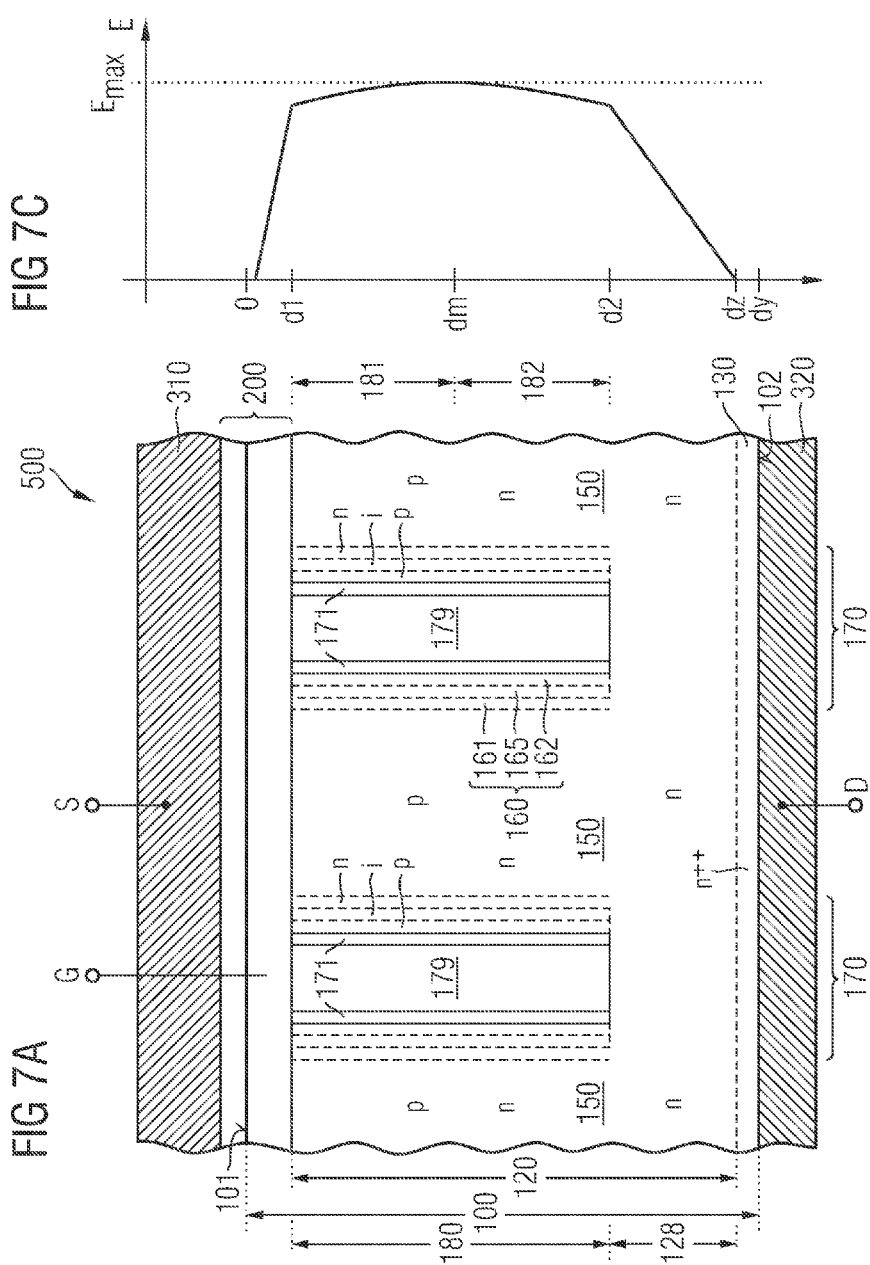

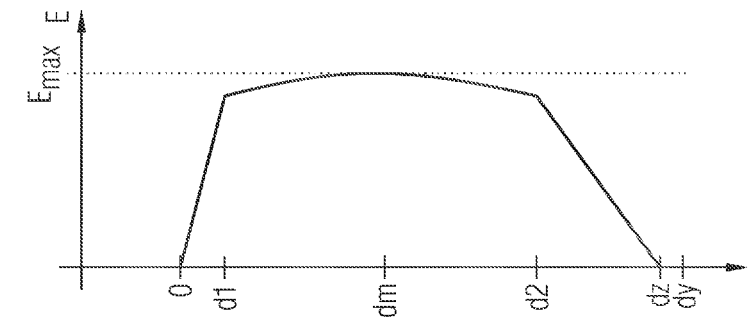
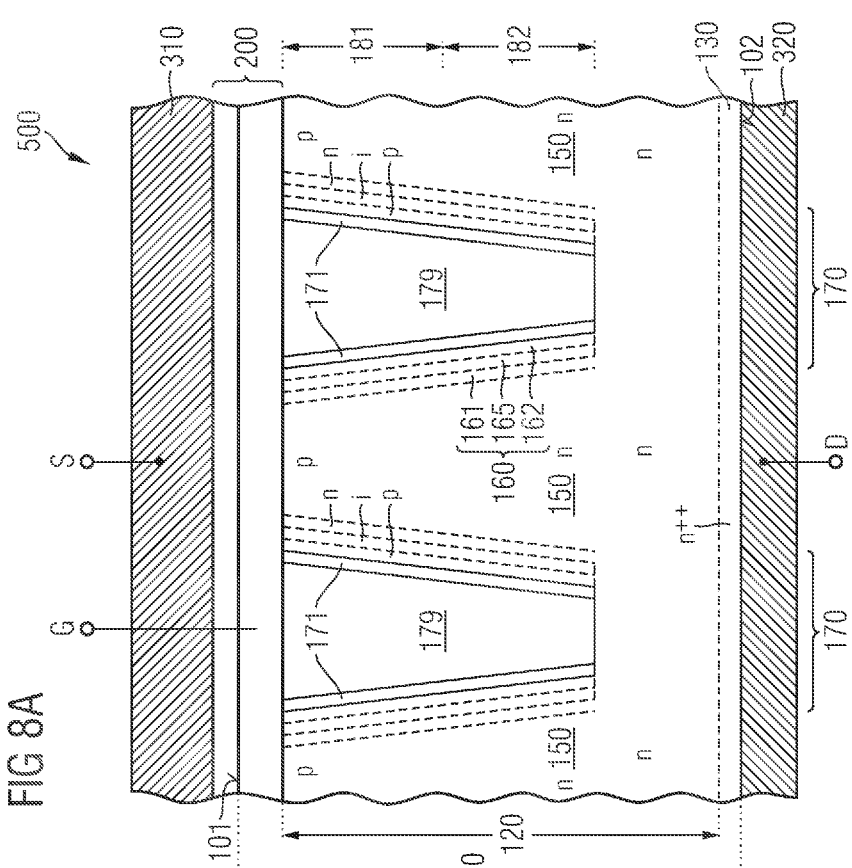
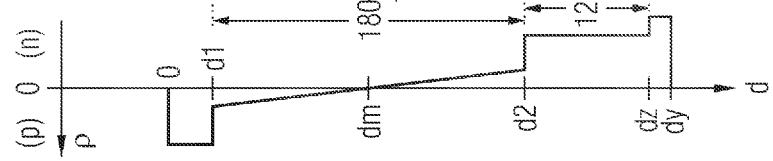

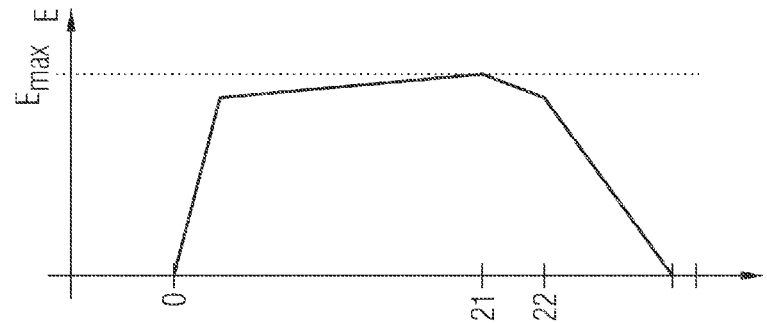
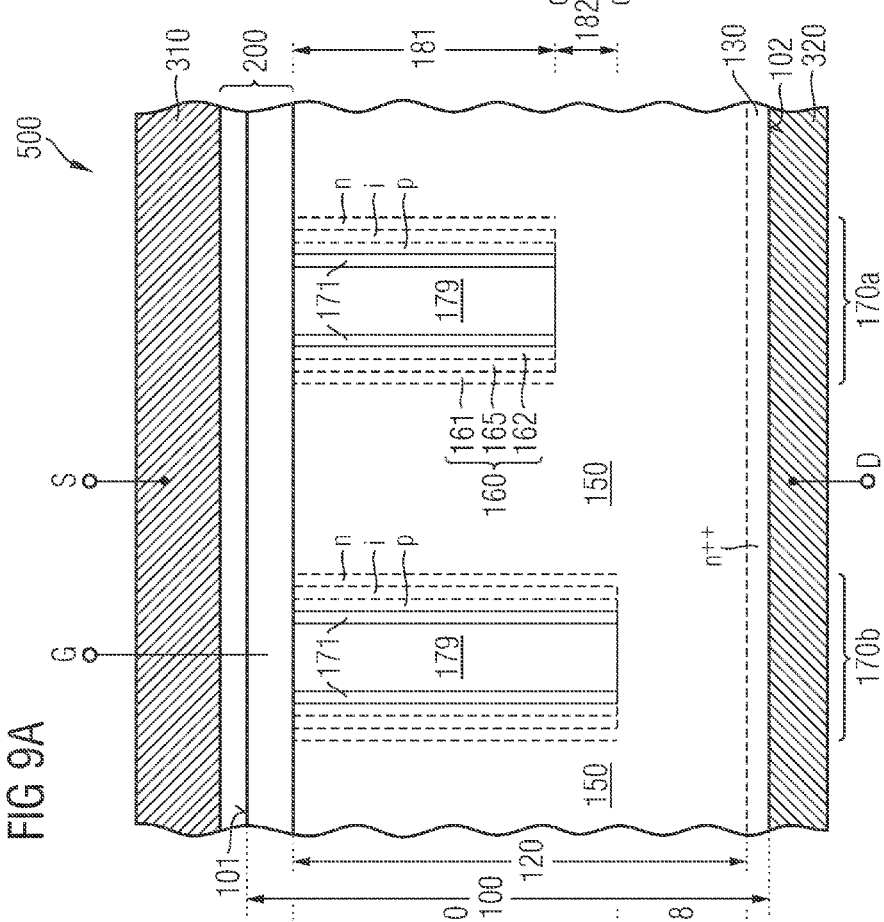
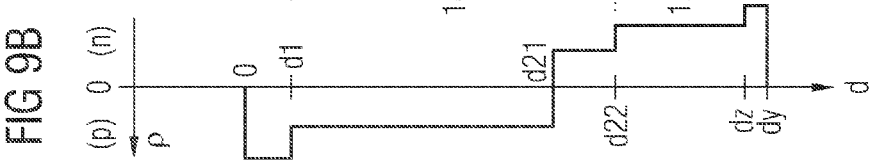

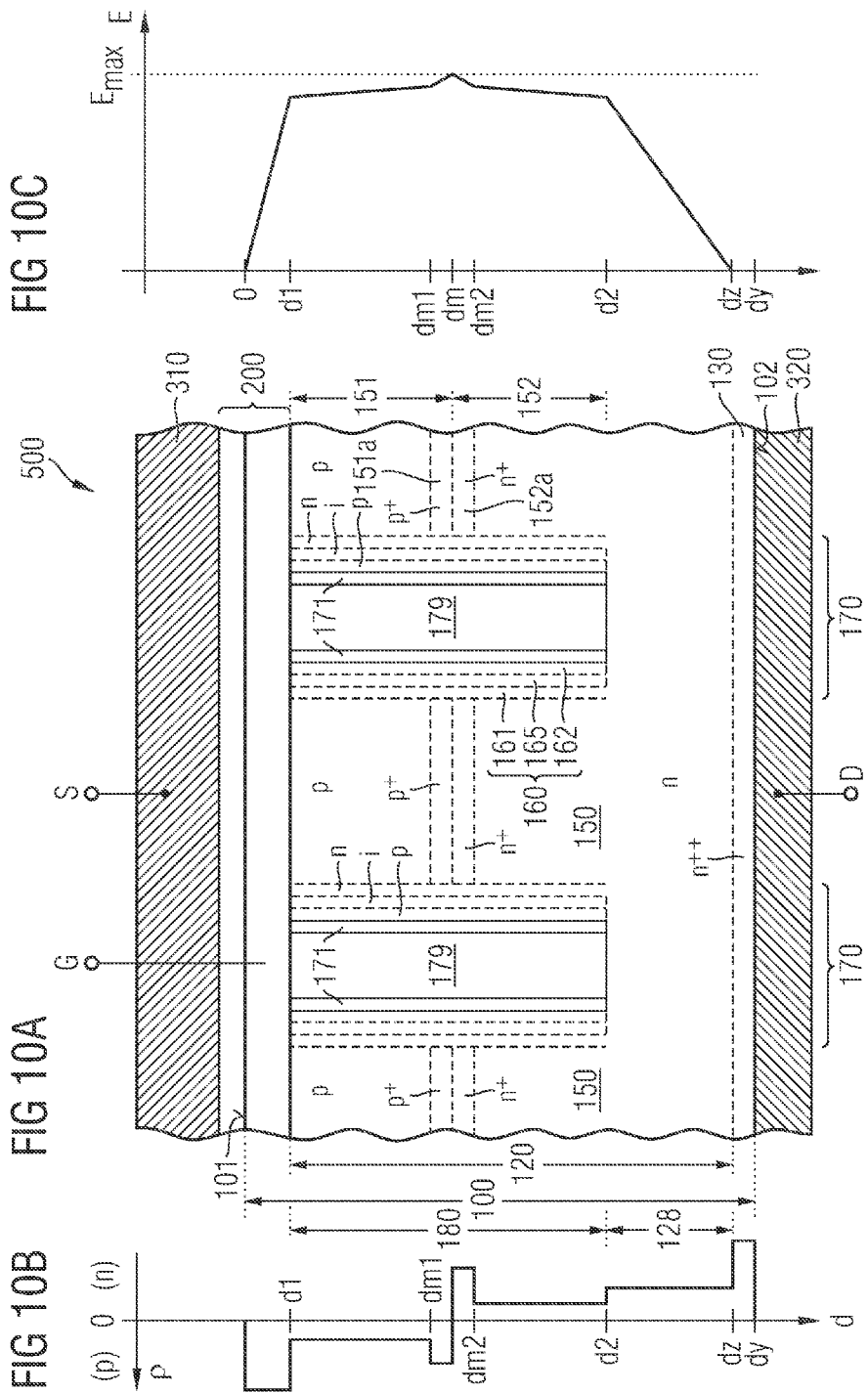

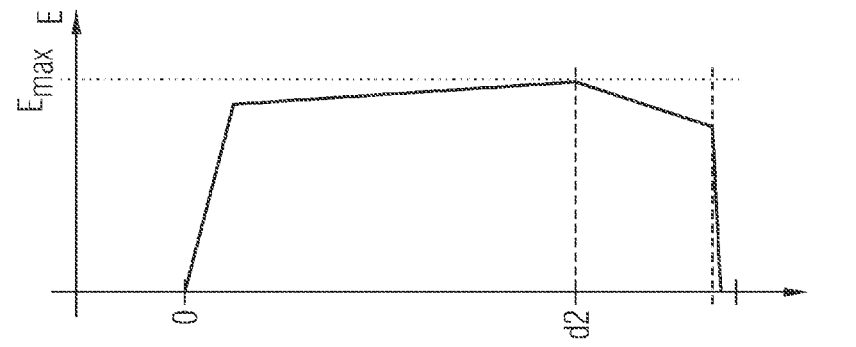
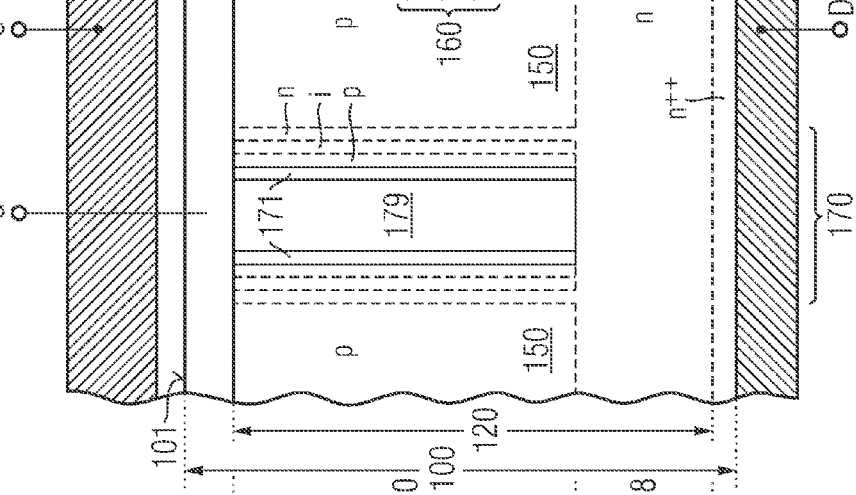
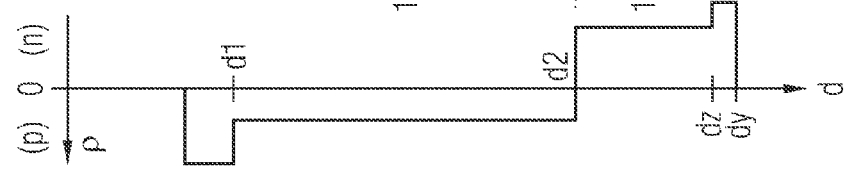

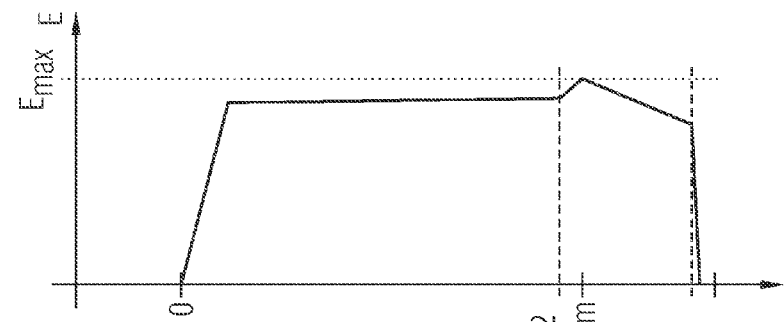
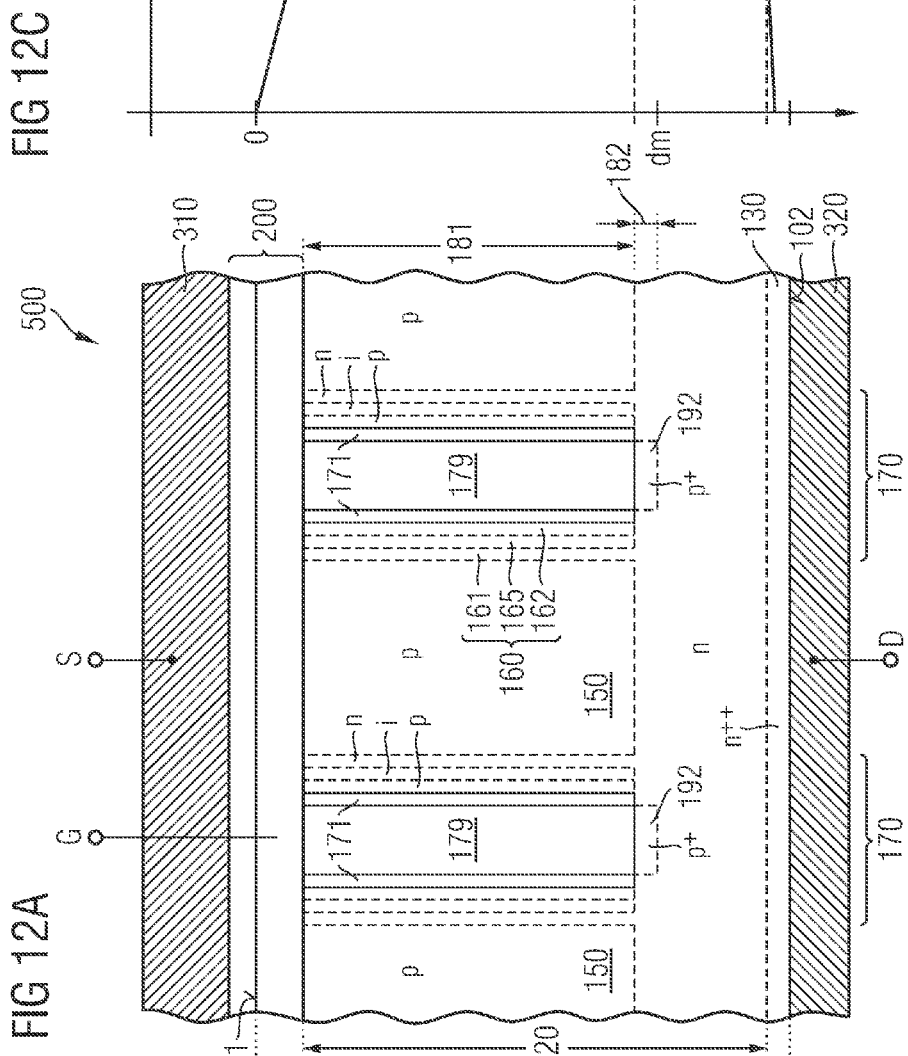
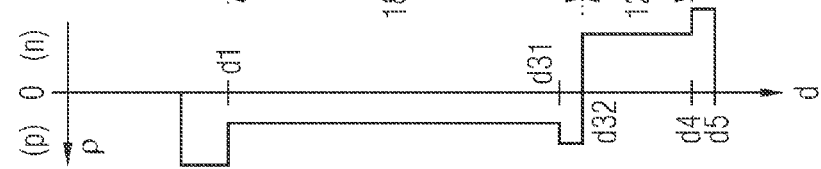

SEMICONDUCTOR DEVICE WITH A SUPER JUNCTION STRUCTURE BASED ON A COMPENSATION STRUCTURE WITH COMPENSATION LAYERS AND HAVING A COMPENSATION RATE GRADIENT

BACKGROUND

A semiconductor portion of a super junction n-FET (field effect transistor) based on a trench concept typically includes complementary doped layers extending parallel to a flow direction of an on-state current. In the reverse blocking mode, the complementary doped layers generate a wide depletion zone within the semiconductor portion, such that a high reverse breakdown voltage can be achieved even at a comparatively high impurity concentration in the complementary doped layers. It is desirable to improve the avalanche ruggedness of super junction semiconductor devices.

SUMMARY

According to an embodiment, a super junction semiconductor device includes a super junction structure that is formed in a semiconductor portion. The super junction structure includes a compensation structure with a first compensation layer of a first conductivity type and a second compensation layer of a complementary second conductivity type. The compensation structure lines at least sidewall portions of compensation trenches that extend between semiconductor mesas along a vertical direction perpendicular to a first surface of the semiconductor portion. Within the super junction structure, a sign of a lateral compensation rate changes along the vertical direction.

According to another embodiment, a super junction semiconductor device includes a super junction structure that is formed in a semiconductor portion. The super junction structure includes a compensation structure with a first compensation layer of a first conductivity type and a second compensation layer of a complementary second conductivity type. The compensation structure lines at least sidewall portions of compensation trenches that extend between semiconductor mesas along a vertical direction perpendicular to a first surface of the semiconductor portion. A pedestal layer of the first conductivity type directly adjoins the super junction structure in the semiconductor portion. Within a vertical section consisting of the super junction structure and the pedestal layer, a sign of a lateral compensation rate changes along the vertical direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and, together with the description, serve to explain principles of the invention. Other embodiments of the invention and intended advantages will be readily appreciated as they become better understood by reference to the following detailed description.

FIG. 1A is a schematic cross-sectional view of a portion of a semiconductor device in accordance with an embodiment.

FIG. 1B is a schematic diagram showing the vertical electric field profile of the semiconductor portion of FIG. 1A.

FIG. 5A is a schematic cross-sectional view of a portion of a semiconductor device in accordance with an embodiment providing semiconductor mesas with sections of different conductivity types.

FIG. 5B is a schematic diagram showing the vertical gradient of the compensation rate in the semiconductor portion of FIG. 5A.

FIG. 5C is a schematic diagram showing the vertical electric field profile in the semiconductor device of FIG. 5A.

FIG. 6A is a schematic cross-sectional view of a portion of a semiconductor device in accordance with an embodiment providing semiconductor mesas with a section irradiated with hydrogen.

FIG. 6B is a schematic diagram showing the vertical gradient of the compensation rate in the semiconductor portion of FIG. 6A.

FIG. 6C is a schematic diagram showing the vertical electric field profile in the semiconductor device of FIG. 6A.

FIG. 7A is a schematic cross-sectional view of a portion of a semiconductor device in accordance with an embodiment providing semiconductor mesas with a graded vertical impurity profile.

FIG. 7B is a schematic diagram showing the vertical gradient of the compensation rate in the semiconductor portion of FIG. 7A.

FIG. 7C is a schematic diagram showing the vertical electric field profile in the semiconductor device of FIG. 7A.

FIG. 8A is a schematic cross-sectional view of a portion of a semiconductor device in accordance with an embodiment providing compensation trenches with tilted sidewalls.

FIG. 8B is a schematic diagram showing the vertical gradient of the compensation rate in the semiconductor portion of FIG. 8A.

FIG. 8C is a schematic diagram showing the vertical electric field profile in the semiconductor device of FIG. 8A.

FIG. 9A is a schematic cross-sectional view of a portion of a semiconductor device in accordance with an embodiment providing compensation trenches of different depths.

FIG. 9B is a schematic diagram showing the vertical gradient of the compensation rate in the semiconductor portion of FIG. 9A.

FIG. 9C is a schematic diagram showing the vertical electric field profile in the semiconductor device of FIG. 9A.

FIG. 10A is a schematic cross-sectional view of a portion of a semiconductor device in accordance with an embodiment providing semiconductor mesas with heavily doped sections.

FIG. 10B is a schematic diagram showing the vertical gradient of the compensation rate in the semiconductor portion of FIG. 10A.

FIG. 10C is a schematic diagram showing the vertical electric field profile in the semiconductor device of FIG. 10A.

FIG. 11A is a schematic cross-sectional view of a portion of a semiconductor device in accordance with an embodiment providing the maximum electric field at the interface between a super junction structure and a pedestal layer.

FIG. 11B is a schematic diagram showing the vertical gradient of the compensation rate in the semiconductor portion of FIG. 11A.

FIG. 11C is a schematic diagram showing the vertical electric field profile in the semiconductor device of FIG. 11A.

FIG. 12A is a schematic cross-sectional view of a portion of a semiconductor device in accordance with an embodiment providing the maximum electric field strength in a pedestal layer.

FIG. 12B is a schematic diagram showing the vertical gradient of the compensation rate in the semiconductor portion of FIG. 12A.

FIG. 12C is a schematic diagram showing the vertical electric field profile in the semiconductor device of FIG. 12A.

DETAILED DESCRIPTION

Figure 2A:
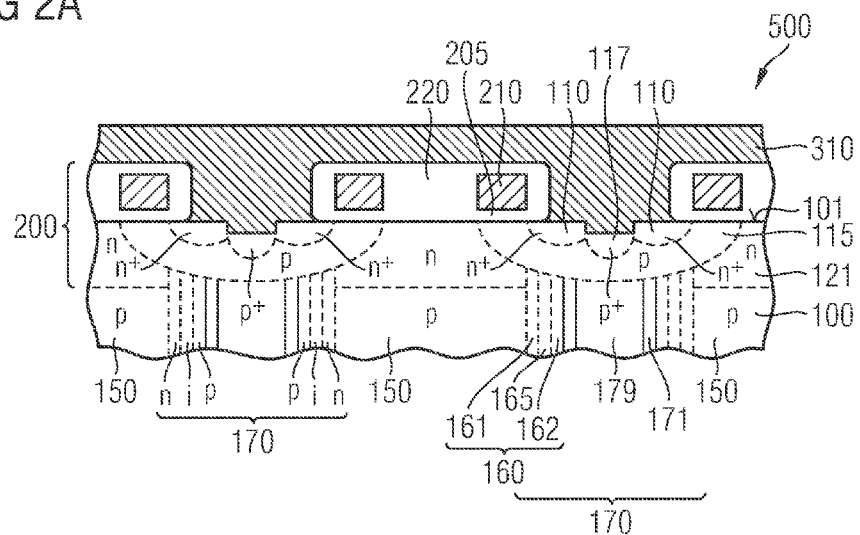
FIG. 2A is a schematic cross-sectional view of a transistor portion of semiconductor devices in accordance with embodiments providing planar transistors with gate electrodes outside a semiconductor portion.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features, but do not preclude additional elements or features. The articles "a", "an" and "the" are intended to include the plural as well as the singular, unless the context clearly indicates otherwise. The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

FIG. 1A shows a super junction semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is at least 40 µm, for example at least 175 µm. The semiconductor portion 100 may have a rectangular shape with an edge length in the range of several millimeters or a circular shape with a diameter of several millimeters. The normal to the first and second surfaces 101, 102 defines a vertical direction and directions orthogonal to the normal direction are lateral directions.

The semiconductor portion 100 may include an impurity layer 130 of a first conductivity type. The impurity layer 130 may extend along a complete cross-sectional plane of the semiconductor portion 100 parallel to the second surface 102. In case the semiconductor device 500 is an IGFET (insulated gate field effect transistor), the impurity layer 130 directly adjoins the second surface 102 and a mean net impurity concentration in the impurity layer 130 is comparatively high and at least 5×1018 cm-3, by way of example. In case the semiconductor device 500 is an IGBT (insulated gate bipolar transistor), a collector layer of a second conductivity type, which is the opposite of the first conductivity type, is arranged between the impurity layer 130 and the second surface 102 and a mean net impurity concentration in the impurity layer 130 may be in a range from about 5×1014 cm-3 to about 5×1016 cm-3, by way of example. The semiconductor portion 100 further includes a drift layer 120 between the first surface 101 and the impurity layer 130. The drift layer 120 includes a super junction structure 180 and may include a pedestal layer 128 of the first conductivity type between the super junction structure 180 and the impurity layer 130. According to other embodiments, the super junction structure 180 may directly adjoin the impurity layer 130.

The super junction structure 180 includes a compensation structure 160, which includes at least a first compensation layer 161 of the first conductivity type and a second compensation layer 162 of the second conductivity type. The compensation structure 160 may include further layers of the first and second conductivity type or intrinsic layers, for example an intermediate intrinsic layer 165 between the first and second compensation layers 161, 162. The compensation structure 160 lines at least sidewall portions of compensation trenches 170 that extend in the vertical direction within the drift layer 120. Interfaces between the layers 161, 162, 165 of the compensation structure 160 are parallel or approximately parallel to an interface between the compensation structure 160 and the material of the semiconductor portion 100. Portions of the single-crystalline semiconductor material of the semiconductor portion between the compensation trenches 170 form semiconductor mesas 150.

The compensation structure 160 may line exclusively straight portions of sidewalls tilted to the first surface 101. According to other embodiments the compensation structure 160 in addition lines a bottom portion connecting the sidewalls, wherein the bottom portion may be curved or approximately planar.

According to the illustrated embodiment, the compensation structure 160 lines the compensation trenches 170 completely. Other embodiments may provide removing the compensation structure 160 from the bottom of the compensation trenches 170 such that the compensation structure 160 is formed exclusively along the sidewalls of the compensation trenches 170.

The layers 161, 162, 165 of the compensation structure 160 are approximately conformal layers having a substantially uniform thickness, respectively. The layers 161, 162, 165 may be single crystalline semiconductor layers grown by epitaxy, with a crystal lattice of the grown semiconductor layers growing in registry with a crystal lattice of the single crystalline semiconductor material of the semiconductor portion 100 or formed by re-crystallization of deposited semiconductor material, for example polycrystalline silicon, using a locally effective heating treatment. The first and second compensation layers 161, 162 may be in-situ doped during epitaxial growth. According to other embodiments, impurities of the first and second conductivity type may be introduced into the respective layers with tilted implants.

The compensation trenches 170 may be parallel stripes arranged at regular distances. According to other embodiments, the cross-sectional areas of the compensation trenches 170 parallel to the first surface 101 may be circles, ellipsoids, ovals or rectangles, e.g., squares, with or without rounded corners. Accordingly, the semiconductor mesas 150 between the compensation trenches 170 may be stripes or may form a grid embedding the compensation trenches 170.

The thickness of the first compensation layer 161 may be at least 10 nm and at most 250 nm, by way of example. The thickness of the second compensation layer 162 may be at least nm and at most 250 nm, wherein the first and second compensation layers 161, 162 may have the same thickness or may have different thicknesses. According to an embodiment, the first compensation layer 161 has a thickness of 50 nm, the second compensation layer 162 a thickness of 50 nm, and the intrinsic layer 165 is about 100 nm thick. In a vertical section unit the total amount of impurities in the first compensation layer 161 may substantially correspond to the total amount of impurities in the second compensation layer 162. For example, both layers 161, 162 may have the same thickness and the same mean net impurity concentration (doping level) of about $2 \times 10^{17}$ cm-3.

In the compensation trenches 170 a dielectric liner 171 may cover and seal the compensation structure 160. The dielectric liner 171 may consist of one single layer or may include two or more sub-layers provided from silicon oxide, silicon nitride, siliconoxynitride, an organic dielectric, for example polyimide, or a silicate glass, for example BSG (boron silicate glass), PSG (phosphorus silicate glass), or BPSG (boron phosphorus silicate glass). The dielectric liner 171 and the compensation structure 160 may fill the compensation trenches 170 completely. According to other embodiments, the dielectric liner 171 lines the compensation structure 160 and leaves an air gap 179 in a central portion of each compensation trench 170. The presence of the air gap avoids mechanical strain which otherwise may be induced into the surrounding semiconductor material by a complete trench fill.

The semiconductor device 100 further includes a control structure 200 with field effect transistor structures for controlling a current flow between the first surface 101 and the second surface 102 through the semiconductor portion 100 in response to a signal applied to a gate terminal G. The control structure 200 includes conductive structures, insulating structures and doped regions formed or buried in the semiconductor portion 100 and may include conductive and insulating structures outside the semiconductor portion 100 as well.

A first electrode structure 310, which may be electrically coupled to a source terminal S in case the semiconductor device 500 is an IGFET, to an emitter terminal in case the semiconductor device 500 is an IGBT, or to an anode terminal in case the semiconductor device 500 is a semiconductor diode, may be electrically connected to the control structure 200 at the side of the first surface 101.

A second electrode structure 320 directly adjoins the second surface 102 of the semiconductor portion 100. According to embodiments related to super junction IGFETs, the second electrode structure 320 directly adjoins the impurity layer 130. According to embodiments related to super junction IGBTs, a collector layer of the second conductivity type may be formed between the impurity layer 130 and the second electrode structure 320. The second electrode structure 320 may be electrically coupled to a drain terminal D in case the semiconductor device 500 is an IGFET, to a collector terminal in case the semiconductor device 500 is an IGBT, or to a cathode terminal in case the semiconductor device 500 is a semiconductor diode.

Each of the first and second electrode structures 310, 320 may consist of or contain, as main constituent(s), aluminum Al, copper Cu, or alloys of aluminum or copper, for example AlSi, AlCu or AlSiCu. According to other embodiments, one or both of the first and second electrode structures 310, 320 may contain one or more layers having nickel Ni, titanium Ti, silver Ag, gold Au, platinum Pt, tungsten W, and/or palladium Pd as main constituent(s). For example, at least one of the first and second electrode structures 310, 320 includes two or more sub-layers, at least one of the sub-layers containing one or more of Ni, Ti, Ag, Au, Pt, W, and Pd as main constituent (s), or silicides and/or alloys there from.

According to the illustrated embodiment, the first conductivity type is the n-type, the second conductivity type is the p-type, the first electrode structure 310 is a source electrode and the second electrode structure 320 is a drain electrode. According to other embodiments, the first conductivity type is the p-type and the second conductivity type is the n-type.

In the semiconductor device 100 of FIG. 1A, a sign of a lateral compensation rate changes along the vertical direction within a vertical section of the drift layer 120 defined by the super junction structure 180, wherein the super junction structure 120 has an impurity distribution that varies with the distance to the first surface 101.

The compensation rate for a vertical section along the vertical extension of the super junction structure 120 may be defined by the difference between the quantity of impurities of the second conductivity type and the quantity of impurities of the first conductivity type related to the greater amount of both values. The total quantity of impurities of the first conductivity type results from the sum of the impurities in the compensation structure, e.g., the first compensation layer 161, and the impurities in the same vertical section in the semiconductor mesas 150. The total quantity of impurities of the second conductivity type is the sum of the impurities in the compensation structure, i.e., the second compensation layer 162, and the corresponding impurities in the same vertical section of the semiconductor mesas 150.

For perfect compensation, the quantities related to an arbitrary section of the vertical extension are equal and the compensation rate in this vertical section is equal 0. With the first conductivity type being the n-type and the second conductivity type being the p-type, the compensation rate is +0.5 when the quantity of p-type impurities in a vertical section of the second compensation layer 162 and the semiconductor mesa 150 is twice the quantity of n-type impurities in a corresponding section of the first compensation layer 161 and the semiconductor mesa 150. The compensation rate is −0.5 when the quantity of p-type impurities in a vertical section of the second compensation layer 162 and the semiconductor mesa 150 is half the quantity of n-type impurities in the corresponding section of the first compensation layer 161 and the semiconductor mesa 150.

According to the illustrated embodiment, the semiconductor mesas 150 have a p-type impurity concentration p1 in a first section 181 of the super junction structure 180 oriented to the first surface 101 and an n-type impurity concentration n1 in a second section 181 oriented to the second surface 102. At equal cross-sectional areas of the first and second compensation layers 161, 162 and a lateral width of the semiconductor mesas 150 being 20 times the layer thickness, the compensation rate for the first section 181 is $(20*p1+p-n)/(20*p1+p)$ and the compensation rate for the second section 182 is $(p-(n+20*n1)):(n+20*n1)$.

With increasing reverse voltage, depletion zones grow in the lateral direction until the first and second compensation layers 161, 162 are completely depleted from mobile charge carriers. In super junction devices with perfect compensation, the charges of the remnant charge carriers completely compensate each other, such that the electric field strength does not change over the complete vertical extension of the super junction structure. Since the integral over the electric field strength between the first and second electrode structures 310, 320 gives that voltage the semiconductor device can accommodate, and since this area is maximized, a high nominal breakdown voltage is achieved.

By contrast, in the super junction device 500 with the compensation rate changing the sign along the vertical extension of the super junction structure 180, impurities of the first conductivity type slightly overcompensate for impurities of the second conductivity type in the second section 182 oriented to the second surface 102 and impurities of the second conductivity type slightly overcompensate for impurities of the first conductivity type in the first section 181 oriented to the first surface 101. The overcompensation may be achieved by varying the impurity concentration in the semiconductor mesas 150 or in the first and second compensation layers 161, 162, and/or by changing the cross-sectional areas of at least one of the layers of the compensation structure 160 and/or the semiconductor mesas 150.

Within each of the first and second sections 181, 182 of the super junction structure 180, the compensation rate may change gradually or in steps along the vertical direction.

The sign of the lateral compensation rate is positive in the first section 181 of the super junction structure 180 oriented to the first surface 101. The sign of the compensation rate is negative in the second section 182 of the super junction structure 180 oriented to the second surface 102.

The first section 181 has an excess of impurities of the second conductivity type. The second section 182 has an excess of impurities of the first conductivity type. The super junction structure 180 may include further sections, for example a transition section 183 defined by a bottom section of the compensation trenches 170. Impurities of the second conductivity type predominate in the first section 181 and impurities of the first conductivity type predominate in the second section 182. As a consequence, the sign of the compensation rate changes once along the vertical extension of the super junction structure 180. The first and second sections 181, 182 may extend at least over a third of the complete vertical extension, respectively. According to an embodiment, the first sections 181 extends over 40% to 60% of the vertical extension of the super junction structure 180 and the second sections 182 extend over a remaining section of the super junction structure 180.

In the reverse mode, after depletion of the super junction structure 180 from mobile charge carriers, the stationary charges do not compensate each other. As a result, in the super junction structure 180 the electric field strength increases from both ends of the super junction structure 180 and reaches a shallow peak at the interface where the sign of the compensation rate changes, as illustrated in FIG. 1B.

According to an embodiment, the amount of the compensation rate in both the first and second vertical sections of the super junction structure is at most 0.5. Although with increasing deviation from perfect compensation, i.e., from a compensation rate=0, the voltage that the semiconductor device 500 can accommodate in the reverse mode decreases, a sufficiently high breakthrough voltage can be obtained. The shallow peak of the electric field strength defines the area where mobile charge carriers are generated when an avalanche breakthrough has been triggered. The amount of the compensation rate in both the first and second sections may be at least 0.02, e.g., at least 0.1, such that a peak range, where the electric field strength is sufficiently high to generate charge carriers in case an avalanche effect has been triggered, is sufficiently small to sufficiently restrict the number of generated charge carriers and to ensure that the voltage across the semiconductor device 500 does not immediately break down.

The resulting electrical field profile (distribution) has a shallow peak approximately in the middle of the vertical extension of the super junction structure. Electrons and holes affect the field distribution both in the breakdown and in the avalanche case. Both types of charge carriers have a stabilizing effect, since both flow from the place of generation into areas in which they compensate for the predominating excess charge of the immobile charge carriers. As a consequence, there is a continuous stability range from p-loaded to n-loaded compensation rates.

FIG. 1B shows an electrical field profile in the semiconductor device 500 of FIG. 1A in case a reverse voltage is applied and no avalanche effect has been triggered. The electric field extends substantially between the heavily doped impurity layer 130 at a distance dz to the first surface 101 and a corresponding heavily doped zone in the control structure 200. The electric field strength increases from both sides up to a distance dm to the first surface 101 where the sign of the compensation rate changes and where the electric field strength reaches a maximum value Emax.

The slope of the electric field strength depends on the value of the compensation rate and is high where the compensation rate is high and low where the compensation rate is low. As a result, a peak area, where the electric field strength is sufficiently high to generate mobile charge carriers in case an avalanche mechanism has been triggered is small, such that the number of generated charge carriers is limited. The shallow peak around Emax ensures that the voltage across the semiconductor device 500 does not immediately break down. The amount of the compensation rate in both the first and second sections is at most 0.5, such that in the reverse mode the semiconductor device 500 can accommodate a sufficiently high breakdown voltage, for example at most 0.1.

Figure 2B:
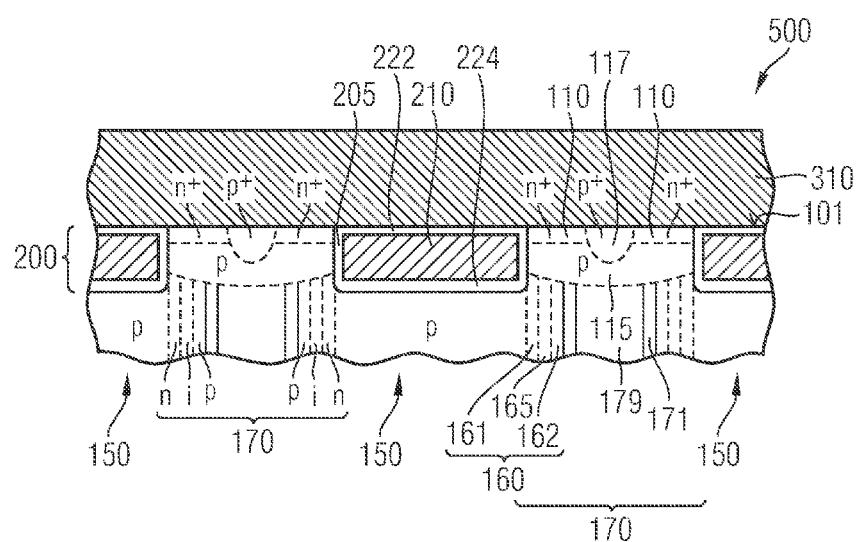
FIG. 2B is a schematic cross-sectional view of a transistor portion of semiconductor devices in accordance with embodiments providing vertical transistors with buried gate electrodes and with source zones provided in the vertical projection of compensation trenches.
Figure 2C:
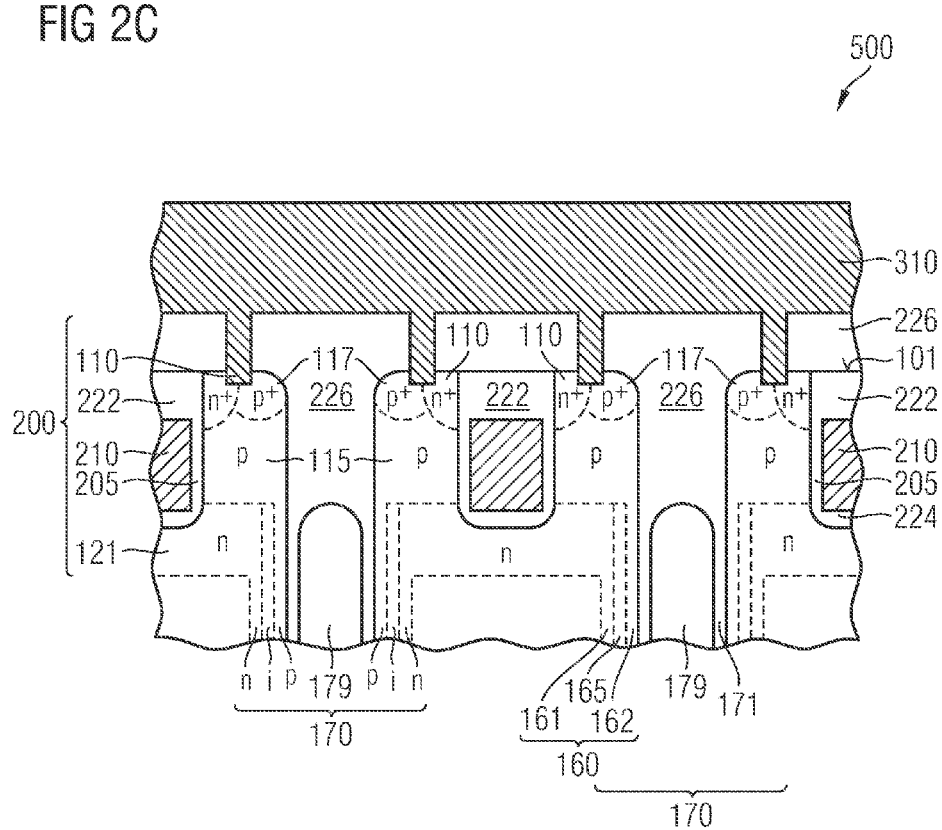
FIG. 2C is a schematic cross-sectional view of a transistor portion of semiconductor devices in accordance with embodiments providing vertical transistors with buried gate electrodes and with source zones provided in semiconductor mesas.

FIGS. 2A to 2C illustrate embodiments of the control structure 200 of the semiconductor device 500. The control portions 200 are based on IGFET cells with the first compensation layer 161 of the compensation structure 160 forming part of the drain structure of the respective IGFET cell.

FIG. 2A shows a control structure 200 including planar FETs with gate electrodes 210 provided outside the semiconductor portion 100. The semiconductor portion 100 includes body zones 115 of the second conductivity type extending from the first surface 101 into the semiconductor portion 100. The body zones 115 may be formed in a semiconductor body that is provided in the vertical projection of the compensation trenches 170 between the compensation trenches 170 and the first surface 101. For example, the semiconductor bodies may be formed by overgrowing previously formed compensation trenches 170 by epitaxy or by annealing a deposited semiconductor layer, for example by using a laser.

The body zones 115 may have a mean net impurity concentration of at least $1 \times 10^{15}$ cm-3 and at most $1 \times 10^{18}$ cm-3. Each body zone 115 may be structurally connected to the second compensation layer 162 of the compensation structure 160 assigned to one compensation trench 170. In each body zone 115, one or two source zones 110 of the first conductivity type are formed as wells embedded in the body zones 115, and extend from the first surface 101 into the base zones 115. Heavily doped contact zones 117 may extend between neighboring source zones 110 into the body zones 115 for providing an ohmic contact between the first electrode structure 310 and the body zones 115.

In each IGFET cell, a gate dielectric 205 capacitively couples a gate electrode 210 with a channel portion of the body zone 115 such that a potential applied to the gate electrode 210 controls the charge carrier distribution in the channel portion between the source zones 110 and link zones 121 of the first conductivity type, which may be formed in the semiconductor mesas 151 along the first surface 101 and which may be structurally connected with the first compensation layer 161. The link zone 121 may directly adjoin the first surface 101 such that in the on state of the IGFET cell, a conductive channel formed in the body zone 115 along the gate dielectric 205 connects the source zone 110 with the first compensation layer 161 through the link zone 121.

A dielectric structure 220 encapsulates the gate electrodes 210 and dielectrically insulates the gate electrodes 210 from the first electrode structure 310. The first electrode structure 310 is electrically connected to the source zones 110 and the contact zones 117 through openings between the insulated gate electrode structures 210.

FIG. 2B corresponds to the control structure 200 of FIG. 2A as regards the formation of the body zones 115, the contact zones 117 and the source zones 110 in a semiconductor layer in the vertical projection of the compensation trenches 170. In contrast to FIG. 2A, buried gate electrodes 210 are formed in gate trenches extending between neighboring compensation trenches 170 into the semiconductor portion 100. The gate trenches may have the same width as the semiconductor mesas 150 between the compensation trenches 170. Channel portions extend through the body zones 115 in a vertical direction along vertical gate dielectrics 205. In each IGFET cell, the channel may be formed between the source zone 110 and the first compensation layer 161 or between the source zone 110 and a link zone, which has the first conductivity type and which is structurally connected with the first compensation layer 161.

A first dielectric structure 222 dielectrically insulates the gate electrode 210 from the first electrode structure 310 and a second dielectric structure 224 dielectrically insulates the gate electrode 210 from the semiconductor mesa 150.

FIG. 2C illustrates a control structure 200 with the gate electrodes 210, the body zones 115 and the source zones 110 formed in the semiconductor mesas 150 between the compensation trenches 170. The gate electrodes 210 are formed in gate trenches extending from the first surface 101 into the semiconductor mesas 150. For each IGFET cell, a first dielectric structure 222 separates the gate electrode 210 from the source zones 110, which extend from the first surface 101 along the gate trench into the semiconductor mesa 150. A second dielectric structure 224 separates the gate electrode from a link zone 121 of the first conductivity type, which is formed in the semiconductor mesa 150 and which is structurally connected to the first compensation layer 161. The body zone 110 is formed in a vertical section of the semiconductor mesas 150 corresponding to the vertical extension of the gate electrodes 210 and is structurally connected to the second compensation layer 162.

A third dielectric structure 226 dielectrically insulates the first electrode structure 310 from the semiconductor mesas 150 and may form plugs in the uppermost portion of the compensation trenches 170. Each plug seals an air gap 179 formed in a central portion of the corresponding compensation trench 170 and protects sidewalls of body zones 115 directly adjoining the compensation trench 170.

Each of the control structures 200 of FIGS. 2A to 2C may be combined with the semiconductor devices 500 as illustrated in the previous and the following Figures.

Figure 3A:
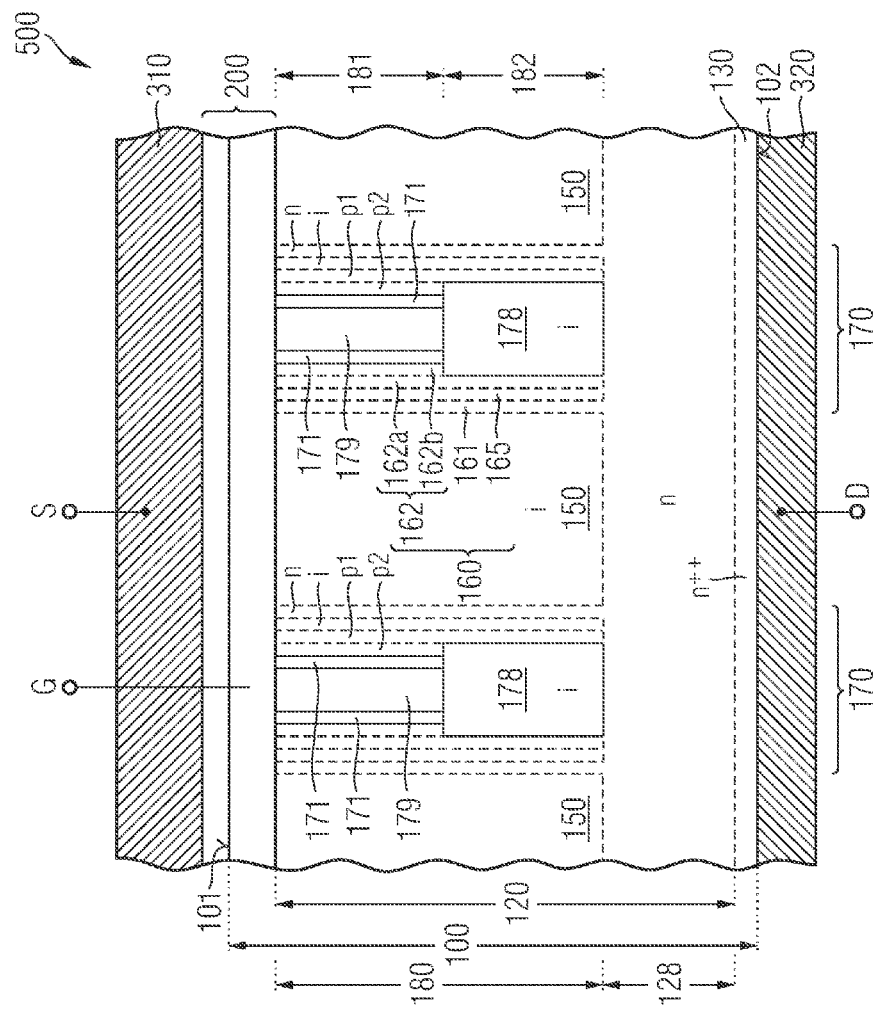
FIG. 3A is a schematic cross-sectional view of a portion of a semiconductor device in accordance with an embodiment providing compensation trenches with a vertically patterned compensation structure.

FIG. 3A refers to an embodiment achieving the change of sign of the compensation rate by a variation of one of the compensation layers 161, 162 of the compensation structure 160 along the vertical direction. The semiconductor portion 100 of the semiconductor device 500 may include a pedestal layer 128 of the first conductivity type and a super junction structure 180 that is based on compensation trenches 170 with substantially vertical sidewalls. The compensation structure 160 is exclusively formed along approximately vertical sidewalls of the compensation trenches 170. In a first section 181 of the super junction structure 180 oriented to the first surface 101 the second compensation layer 162 includes a first sub-layer 162a and a second sub-layer 162b. In the second section 182 oriented to the second surface 102 the second compensation layer 162 includes only the first sub-layer 162a, whereas the second sub-layer 162b is absent in the second section 182. The semiconductor mesas 150 between the compensation trenches 170 may be intrinsic, lightly n-doped, or lightly p-doped.

In an arbitrary vertical sub-section of the first section 181, the total amount of impurities in the second compensation layer 162 is greater than in the first compensation layer 161, whereas in an arbitrary vertical sub-section of the second section 182 the total amount of impurities in the second compensation layer 162 is lower than in the first compensation layer 161. For example, the first and second sub-layers 162a, 162b may have the same impurity concentration than the first compensation layer 161, the first sub-layer 162a is thinner than the first compensation layer 161, and the first and second sub-layer 162a, 162b in total are thicker than the first compensation layer 161. According to another embodiment, the first sub-layer 162a is as thick as the first compensation layer 161 and has a lower impurity concentration than the first compensation layer 161, and the impurities of the first and second sub-layer 162a, 162b exceed the impurities in the first compensation layer 161.

In the first section 181, the total amount of impurities in a vertical section of the second compensation layer 162 is greater than in a corresponding vertical section of the first compensation layer 161, resulting in a positive electric field gradient with increasing distance to the first surface 101. In the second section 182 of the super junction structure 180, the total amount of impurities in a vertical section of the second compensation layer 162 is lower than in a corresponding vertical section of the first compensation layer 161, resulting in a negative electric field gradient with increasing distance to the first surface 101. An intrinsic semiconductor plug 178 may be provided after forming the first sub-layer 162a and before forming the second sub-layer 162b in the first section 181.

Figure 3B:
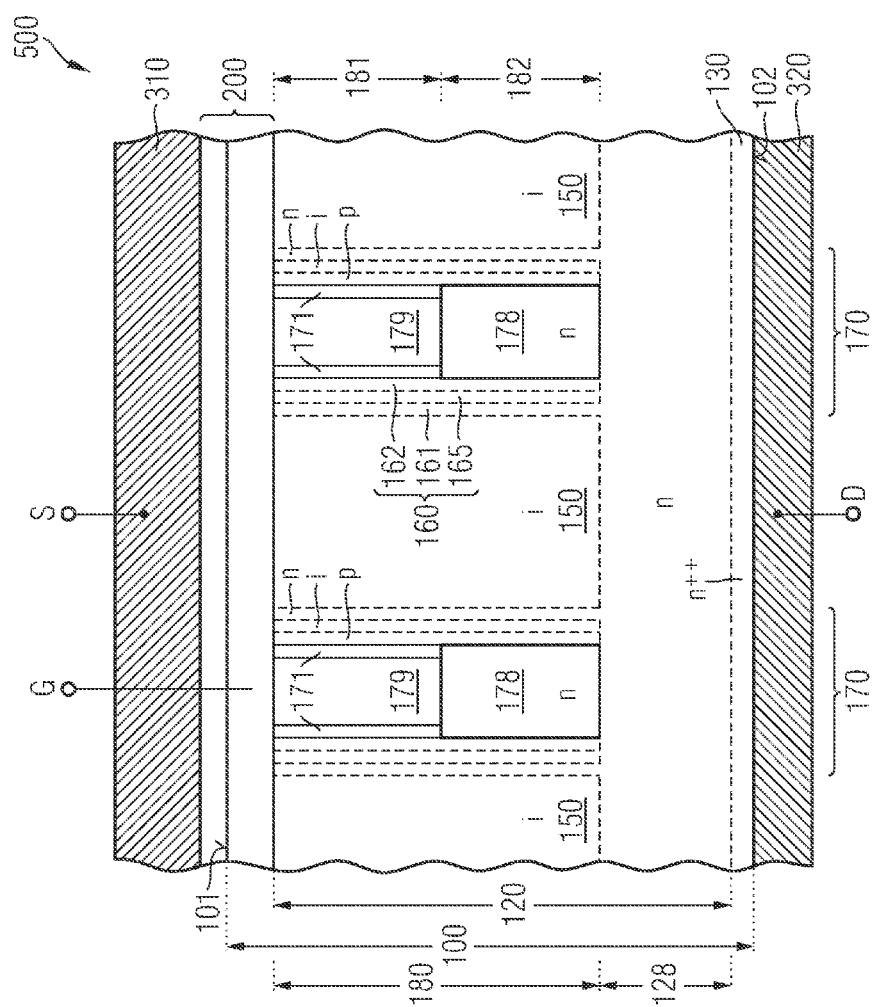
FIG. 3B is a schematic cross-sectional view of a portion of a semiconductor device in accordance with an embodiment providing compensation trenches partially filled with non-intrinsic semiconductor plugs.

The semiconductor device 500 of FIG. 3B differs from the semiconductor device of FIG. 3A in that the semiconductor plug 178 in the second section 182 has the first conductivity type. The total impurity amount in the first compensation layer 161 is lower than in the second compensation layer 162, such that in the first section 181 the conductivity type of the second compensation layer 162 predominates. The total amount of impurities in the semiconductor plug 178 is selected such that in the second section 182 the conductivity type of the first compensation layer 161, which is the first conductivity type, predominates, resulting in a vertical electric field profile similar to that illustrated in FIG. 1B.

Figure 3C:
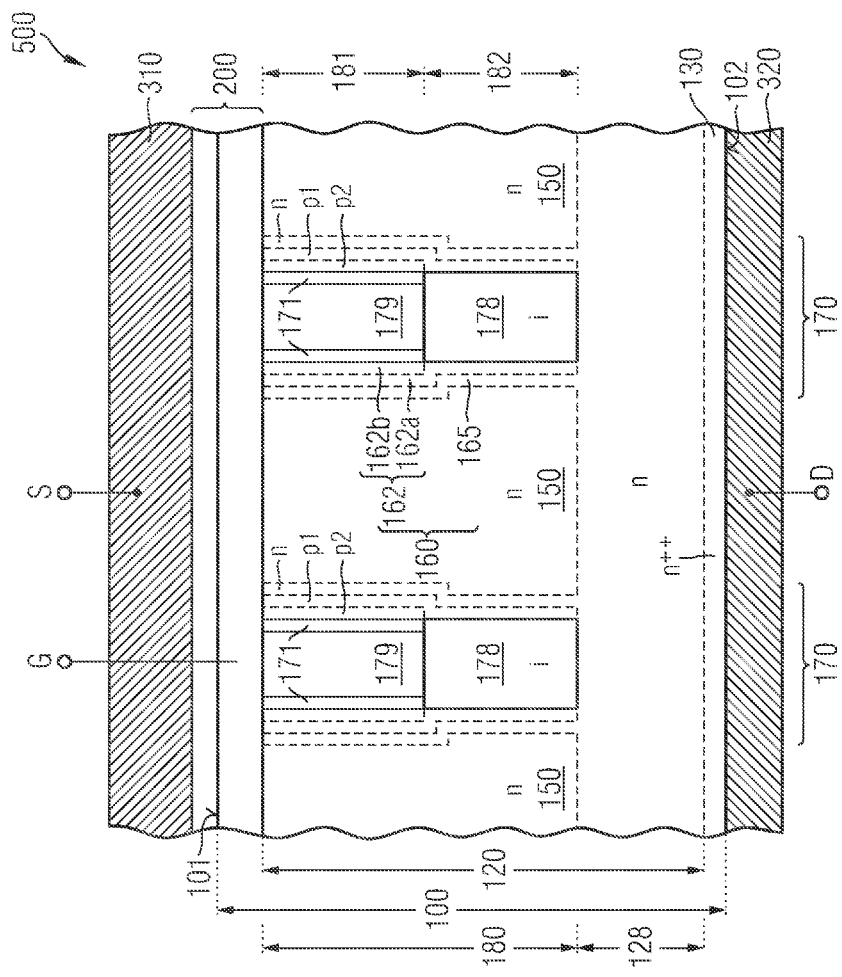
FIG. 3C is a schematic cross-sectional view of a portion of a semiconductor device in accordance with an embodiment providing compensation trenches partially filled with intrinsic semiconductor plugs.

FIG. 3C illustrates compensation trenches 170 having a wide portion in the first section 181 and a narrow portion in the second section 182. A semiconductor plug 178, which may be an intrinsic plug, may fill the narrow portion completely. In the wide portion, the second compensation layer 162 of the compensation structure 160 includes a second sub-layer 162b that is absent in the narrow portion, such that the gradient of the compensation rate can be adjusted to obtain a vertical electric field profile as illustrated in FIG. 1B.

In the following, the first conductivity type is assumed to be the n-type and the second conductivity type to be the p-type. Complementary embodiments with n-type structures replaced with p-type structures and p-type structures replaced with n-type structures work, as well.

Figure 4:
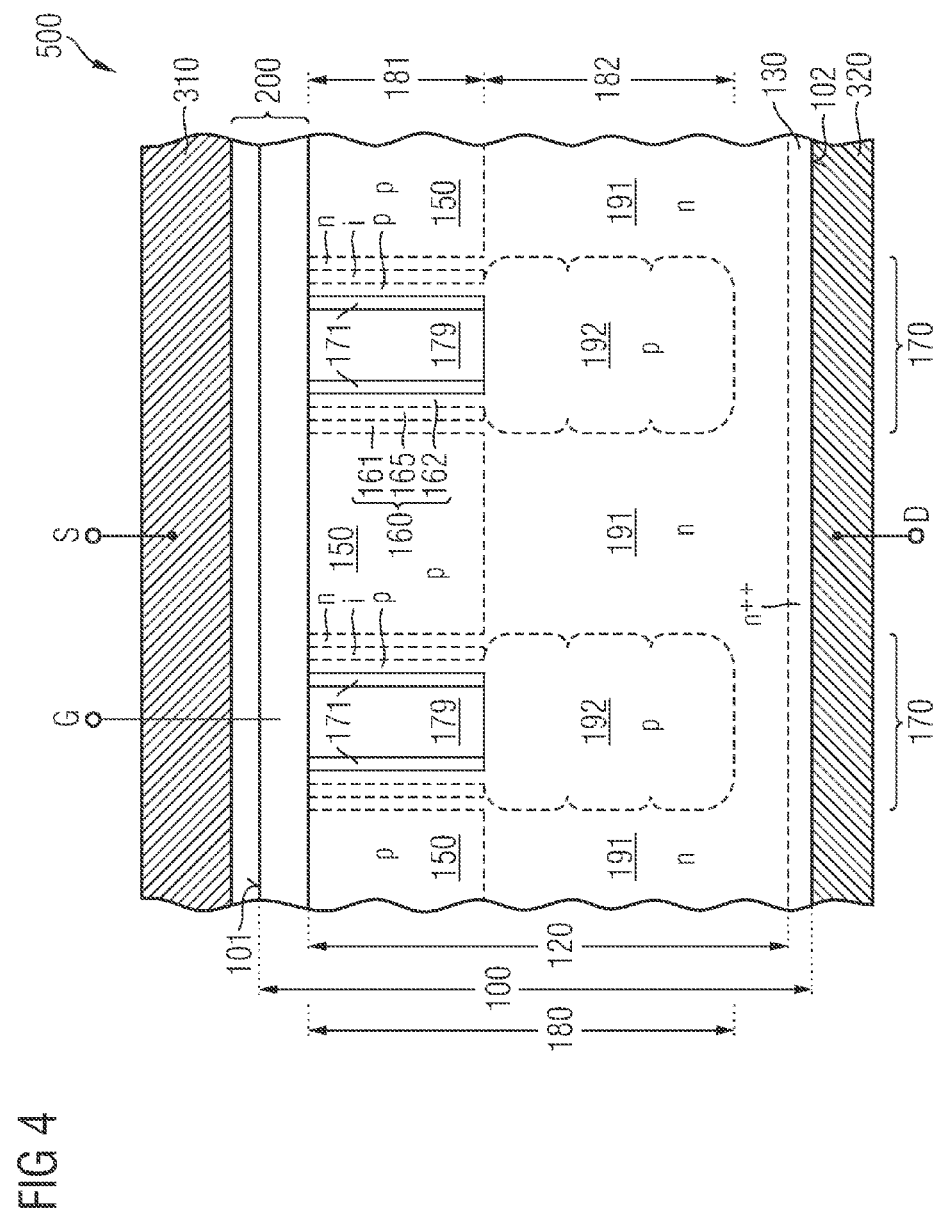
FIG. 4 is a schematic cross-sectional view of a portion of a semiconductor device in accordance with an embodiment providing a super junction structure including columnar impurity structures in the vertical projection of compensation trenches.

In FIG. 4, the super junction structure 180 of the semiconductor device 500 includes a compensation structure 160 in the first section 181 and a columnar structure in the second section 182. The compensation structure 160 includes at least an n-type first compensation layer 161 and a p-type second compensation layer 162, and lines vertical sidewalls of compensation trenches 170. The compensation structure 160 may include further layers, for example an intrinsic layer 165 between the first and the second compensation layers 161, 162. A dielectric liner 171 may cover the compensation structure 160 and may seal a void that is formed in the central portion of each compensation trench 170. The columnar structure includes n-type column-like first compensation zones 191 in the vertical projection of the semiconductor mesas 150 and p-type column-like second compensation zones 192 in the vertical projection of the compensation trenches 170.

The n-type first compensation zones 191 are structurally connected with the first compensation layer 161 of the compensation structure 160. The p-type second compensation zones 192 are structurally connected with the second compensation layer 162 of the compensation structure 160.

The semiconductor mesas 150 may be intrinsic or lightly p-doped. The thickness of the first and second compensation layers 161, 162, the width of the mesa portions 150 as well as the impurity concentrations in the compensation structure 160 and the semiconductor mesas 150 are selected such that the first section 181 is intrinsic or p-loaded and the compensation rate is zero or positive. In the second section 182, the lateral dimensions of and the impurity concentrations in the first and second compensation zones 191, 192 are selected such that the second section 181 is n-loaded or intrinsic in the case the first section is p-loaded, or n-loaded in the case the first section is intrinsic.

The columnar structure in the second section 182 may be formed by repeating at least once a sequence comprising (i) growing an intrinsic sub-layer or a sub-layer of a first conductivity type, (ii) forming an implant mask on an exposed surface of the grown semiconductor sub-layer, (iii) implanting impurities of a second, complementary conductivity type through openings in the implant mask into the grown semiconductor sub-layer, and (iv) removing the implant mask, wherein openings in any further implant mask on the next grown sub-layer are vertically aligned with the previous implants. The approach leaves more leeway for adjusting on-state resistance, maximum breakdown voltage and the vertical electric field profile of the semiconductor device 500.

The semiconductor device 500 of FIGS. 5A to 5C includes a semiconductor portion 100 with a first surface 101, a super junction structure 180 and an impurity layer 130 of a first conductivity type. The impurity layer 130 directly adjoins a second surface 102 of the semiconductor portion 100 which is parallel to the first surface 101 at a distance dy, typically at least 40 μm. According to the illustrated embodiment, a pedestal layer 128 of the first conductivity type is formed between the super junction structure 180 and the impurity layer 130. According to other embodiments, the super junction structure 180 may directly adjoin the impurity layer 130. Portions of a control structure 200 may be formed between the first surface 101 and the super junction structure 180. A further portion of the control structure 200 may be provided outside the semiconductor portion 100 along the first surface 101.

The super junction structure 180 includes a compensation structure 160 including a first compensation layer 161 and a second compensation layer 162. According to an embodiment, the compensation structure 160 consists of the first and the second compensation layers 161, 162. According to other embodiments the compensation structure 160 may include further layers, for example an intrinsic layer 165 which may be located between the first and the second compensation layers 161, 162. The compensation structure 160 covers vertical sidewall portions of compensation trenches 170 extending between the control structure 200 and the pedestal layer 128 or between the control structure 200 and the impurity layer 130. The compensation structure 160 may fill the compensation trenches 170 only partly such that an air gap is left in a central portion of each compensation trench 170.

A dielectric liner 171 may passivate the compensation structure 160 with respect to the air gap 179. The dielectric liner 171 may be provided exclusively on the compensation structure 160 or may cover both the compensation structure 160 and portions of the semiconductor material of the semiconductor portion 100 at the bottom of the compensation trenches 170. In the compensation structure 160, the first compensation layer 161 is oriented to semiconductor mesas 150 formed between adjacent compensation trenches 170, whereas the second compensation layer 162 is oriented to the inner portion of the compensation trench 170, e.g., the air gap 179.

The compensation structure 160 may include further layers, for example further intrinsic layers. Other embodiments may include several pairs of layers of the first and second conductivity type, which may directly adjoin to each other or which may be separated by intrinsic layers, respectively. Other embodiments may provide an intrinsic layer or a lightly doped layer of the first conductivity type between the second compensation layer 162 and the dielectric liner 171.

A first section 181 of the super junction structure 180 oriented to the first surface 101 is p-loaded, whereas a second section 182 directly adjoining the first section 101 along the vertical direction and oriented to the second surface 102 is n-loaded. According to the following embodiments, the impurity distributions in the first and the second compensation layers 161, 162 and the thicknesses of the first and the second compensation layers 161, 162 are uniform. If the amount of impurities in the second compensation layer 162 exceeds the amount of impurities in the first compensation layer 161, a first mesa section 151 of the semiconductor mesas 150 oriented to the first surface 101 may be intrinsic, lightly p-doped or even lightly n-doped, wherein in each case the first section 181 of the super junction structure 180 is p-loaded. In case of an intrinsic first mesa section 151, the second mesa portion 152 oriented to the second surface 102 may be lightly n-doped. In case of a p-doped first mesa section 151, the second mesa portion 152 may be intrinsic or lightly n-doped. In case of an n-doped first mesa section 151, the second mesa section 152 is also n-doped and has a higher mean impurity concentration than the first mesa section 151.

As shown in FIG. 5B, the compensation rate ρ changes from p-loaded to n-loaded at an interface between the first and the second super junction section 181, 182 corresponding to the interface between the first and second mesa sections 151, 152. Due to the presence of p-doped base zones in the control structure 200, the compensation rate ρ indicates a higher p-load between the first surface 101 and the upper edge of the super junction structure 180 at a distance d1 to the first surface 101. Due to the absence of the p-doped first compensation layer 161, the compensation rate in the pedestal layer 128 is more n-loaded than in the second section 182 and even more n-loaded in the impurity layer 130.

FIG. 5C shows the corresponding vertical electrical field profile. The electric field substantially extends between a heavily p-doped contact zone in the control structure 200 and the interface between the pedestal layer 128 and the impurity layer 130 at a distance dz to the first surface 101. Outside the super junction structure 180 the impurities in the semiconductor portion 100 are strongly unbalanced and the electric field sharply increases with decreasing distance to the super junction structure 180. From the upper and lower edges of the nearly compensated super junction structure 180 at the distances d1 and d2 the electric field strength smoothly approximates the maximum electric field strength Emax that is obtained at the interface between the first and second sections 181, 182 of the super junction structure 180 at a distance dm to the first surface 101.

In case an avalanche mechanism is triggered, charge carrier generation is restricted to a comparatively small portion of the semiconductor portion 100. In addition, avalanche ruggedness depends less on deviations of the compensation rate resulting from process fluctuations during manufacture of the semiconductor device 500.

In the semiconductor device 500 of FIGS. 6A to 6C, the semiconductor mesas 150 have a homogeneous impurity distribution as regards donors and acceptors, and both mesa sections 151, 152 have the same conductivity type, for example intrinsic, p-doped or lightly n-doped, with an excess of impurities in the second compensation layer 162 with respect to the impurities in the first compensation layer 161 in the latter case. In addition, the semiconductor portion 100 includes a hydrogen-implanted zone 127 overlapping the second mesa section 152 and the pedestal layer 128 and being absent in the first mesa section 151. The implanted protons or lattice disturbances caused by the hydrogen implant modulate the distribution of the n-type impurities such that the vertical profile of the compensation rate has a step from p-loaded to n-loaded at the upper edge of the hydrogen implant zone 127.

The hydrogen implant may be performed as an unmasked implant through the second surface 102 and can be combined with thin-wafer approaches providing a thinning of the semiconductor portion from a rear side at the second surface 102. The hydrogen-implant provides an approximately uniform distribution of the implanted protons along the vertical direction with a shallow peak at the end of the implantation range.

As shown in FIGS. 6B and 6C, the hydrogen-implanted zone may generate approximately the same compensation rate profile and the same vertical electric field profile as the embodiment of FIGS. 5A to 5C, without varying the impurity type in the semiconductor mesas 150.

FIGS. 7A to 7C refer to a graded transition of the compensation rate ρ from p-loaded to n-loaded in the super junction structure 180. For example, in the semiconductor mesas 150 the p-type impurity concentration decreases, e.g., linearly, with increasing distance to the first surface 101, or an n-type impurity concentration increases, e.g., linearly, with increasing distance to the first surface 101, or both.

FIG. 7B shows a linear transition of the compensation rate ρ along the vertical extension of the super junction structure 180.

The linear profile of the compensation rate results in a parabolic profile of the electric field strength along the vertical extension of the super junction structure 180 as shown in FIG. 7C. The gradual variation of the compensation rate may be obtained by an in-situ time-dependent addition of impurities during the epitaxial growth of the drift layer 120.

According to the embodiment of FIG. 8A, a lateral cross-sectional area of the semiconductor mesas 150 parallel to the first surface 101 increases with increasing distance to the first surface 101. According to an embodiment, the compensation trenches 170 taper with increasing distance to the first surface 101. The semiconductor mesas 150 may have the n-type. The total amount of n-type impurities in an arbitrary vertical subsection of the super junction structure 180 increases with increasing distance to the first surface 101, resulting in a gradual transition of the compensation rate ρ from p-loaded to n-loaded, wherein the p-type second compensation layer 162 of the compensation structure 160 overcompensates the n-type first compensation layer 161 in a first section 181 of the super junction structure 180 oriented to the first surface 101.

As shown in FIGS. 8B and 8C, the vertical compensation rate profile and the vertical electric field profile of the embodiment of FIGS. 7A to 7C can be achieved, without variation of the impurity concentrations in the semiconductor mesas 150 and the compensation layers 161, 162.

The embodiment of FIGS. 9A to 9C refers to a depth variation of the compensation trenches 170, which may result from providing the compensation trenches 170 with at least two different widths and by exploiting the fact that in some etch regimes the etch depth may depend on the width of a trench to be etched.

First compensation trenches 170a extend up to a first distance d21 and second compensation trenches 170b extend up to a second distance d22, with regard to the first surface 101. Up to the first distance d21, the compensation structure 160 in the first and second compensation trenches 170a, 170b provides a p-load, whereas between the first and second distances d21, d22 only the part of the compensation structure 160 in the second compensation trenches 170b includes p-type impurities. Thickness and impurity concentrations in the compensation layers 161, 162 as well as width and impurity concentration in the semiconductor mesas 150 are adjusted such that a first section 181 of the super junction structure 180 between the control structure 200 and the first depth d21 is p-loaded and a second section 182 between the first depth d21 and the second depth d22 is n-loaded, as shown in FIGS. 9B and 9C. For example, the semiconductor mesas 150 may be lightly n-doped and the compensation structure is adjusted to overcompensate the semiconductor mesas in the first section 181.

The semiconductor device 500 of FIGS. 10A to 10C generally corresponds to the semiconductor device 500 of FIGS. 5A to 5C. In addition, the first mesa section 151 includes a heavily doped portion 151a in a section oriented to the second mesa portion 152 and the second mesa portion 152 includes a heavily doped portion 152a in a section oriented to the first mesa section 151. The two heavily doped portions 151a, 152a may directly adjoin each other such that they form an interface as shown in FIG. 10A. Outside the heavily doped portions 151a, 152a, the first mesa section 151 may be intrinsic or p-doped and the second mesa section 152 may be intrinsic or n-doped.

FIG. 10B shows the vertical profile of the compensation rate ρ changing from heavy p-loaded between dm1 and dm to heavy n-loaded between dm and dm2 along the interface between the first and second mesa sections 151, 152 at dm.

Accordingly, the vertical electric field profile shown in FIG. 10C shows a sharp peak at the interface between the first and second mesa sections 151, 152. In case an avalanche mechanism has been triggered, the peak concentrates the charge carrier generation to a higher degree in a comparatively narrow portion of the drift zone 120 around dm. The number of generated charge carriers as a function of the applied reverse voltage is reduced, and a current threshold for oscillations is increased.

The semiconductor device 500 of FIGS. 11A to 11C includes a semiconductor portion 100 with a super junction structure 180. The super junction structure 180 includes a compensation structure 160 with a first compensation layer 161 of a first conductivity type and a second compensation layer 162 of a complementary second conductivity type, wherein the compensation structure 160 lines at least sidewall portions of compensation trenches 170 that extend between semiconductor mesas 150 along a vertical direction perpendicular to a first surface 101 of the semiconductor portion 100. The super junction structure 180 is lightly p-loaded.

A pedestal layer 128 of the first conductivity type directly adjoins the super junction structure 180 in the semiconductor portion 100. At an interface between the pedestal layer 128 and the p-loaded super junction structure 180 at a distance d2 to the first surface 101, a sign of a lateral compensation rate changes along the vertical direction.

The semiconductor device 500 of FIG. 12A has a super junction structure 180 including a first section 181 with a compensation structure 160 as described above and a second section 182 formed by p-doped compensation zones 192 directly adjoining the second compensation layer 162 and extending from a bottom of the compensation trenches 170 further into the semiconductor portion 100. The p-doped compensation zones 192 may be formed by an implant through the bottom of the compensation trench 170.

In other words, the pedestal layer 128 may include compensation zones 192 of the second conductivity type in the vertical projection of the compensation trenches 170, wherein the compensation zones 192 directly adjoin the second compensation layer 162 and the sign of the lateral compensation rate changes in the pedestal layer.

FIGS. 12B to 12C show the resulting vertical compensation rate profile and the resulting vertical electric field profile.

Figure 13:
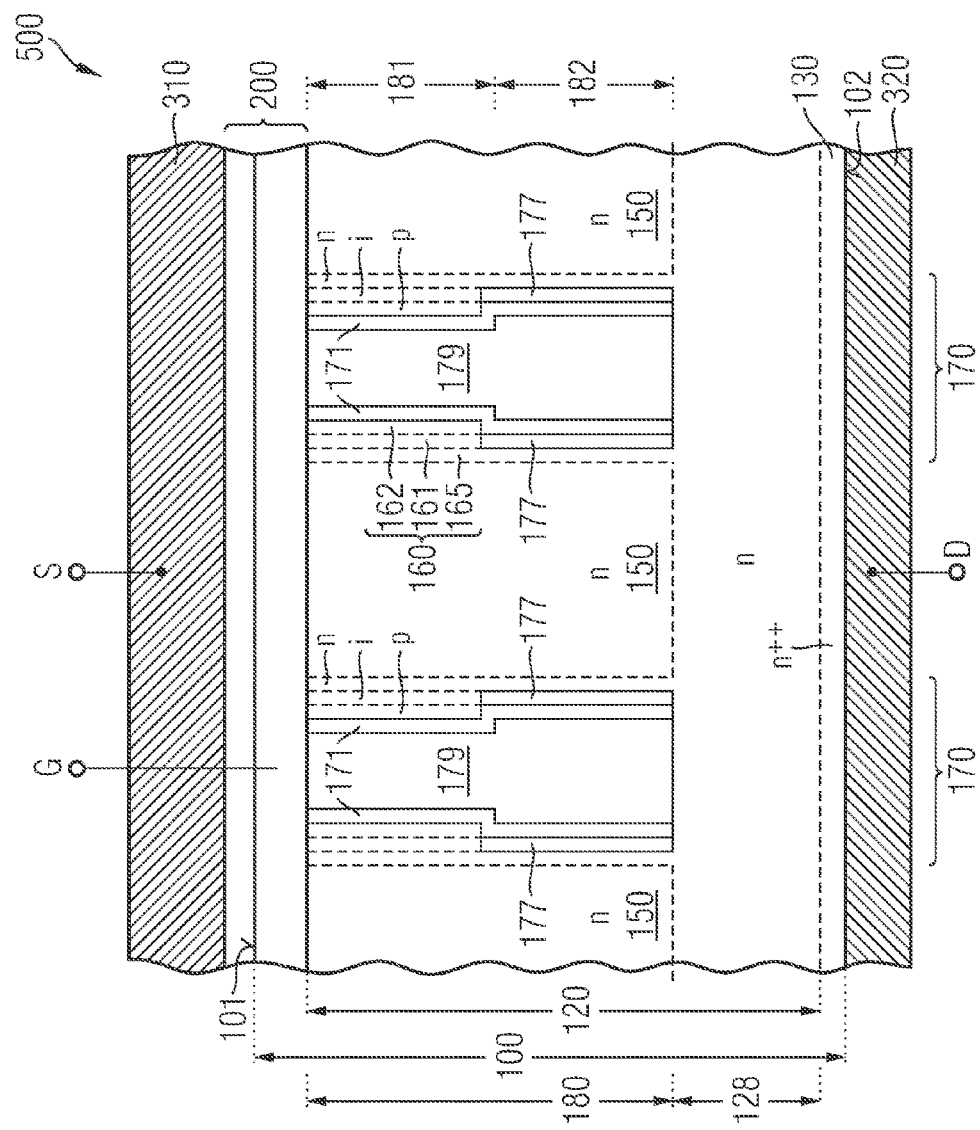
FIG. 13 is a schematic cross-sectional view of a portion of a semiconductor device in accordance with an embodiment providing a vertically patterned compensation structure.

The compensation structure 160 of the semiconductor device 500 of FIG. 13 is formed only in the first section 181 of the super junction structure 180 where the second compensation layer 162 overcompensates the first compensation layer 161 and n-type semiconductor mesas 150. The n-type semiconductor mesas 150 provide the n-loaded second section 182.

For example, after formation of the compensation trenches 170 a vertical mask 177 may be provided that covers sidewall portions of the compensation trenches 170 or portions of previously deposited layers of the compensation structure 160 in the second section 182. The following layers of the compensation structure 160 are exclusively formed on the exposed sidewall portions of the compensation trenches 170 or on the exposed portions of the yet deposited layers in the first section 181, for example by growing them by epitaxy or by chemical vapor deposition.

According to an embodiment, the vertical mask 177 is provided after deposition of the first compensation layer 161 and before deposition or finalizing of the second compensation layer 162, such that a contiguous layer of the first conductivity type through the super junction structure 180 in the vertical direction provides a low-resistance path for the on-state current.

Features of the above-described embodiments may be combined with each other. For example, depth variations of the compensation trenches 170 as illustrated in FIGS. 9A to 9C may be combined with changing impurity concentrations in the mesa sections 151, 152 as described in the context of FIGS. 5A to 5C. Such combination may provide a change of sign in approximately the middle of the semiconductor device and a change to even more n-load at the end of the shallower compensation trenches.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device comprising:
   a super junction structure formed in a semiconductor portion, wherein the super junction structure comprises a compensation structure comprising a first compensation layer of a first conductivity type and a second compensation layer of a complementary second conductivity type, the compensation structure lining at least sidewall portions of compensation trenches that extend between semiconductor mesas along a vertical direction perpendicular to a first surface of the semiconductor portion, wherein
   (i) in a first section of the super junction structure oriented to the first surface the second compensation layer includes a first sub-layer and a second sub-layer and, in a second section oriented to a second surface of the semiconductor portion parallel to the first surface, the second compensation layer comprises only the first sub-layer, and
   a sign of a lateral compensation rate changes along the vertical direction within the super junction structure, respectively.

2. The super junction semiconductor device according to claim 1, further comprising:
   a control structure between the first surface and the super junction structure, the control structure comprising (i) body zones of the second conductivity type structurally connected with the second compensation layer and (ii)

source zones of the first conductivity type structurally separated from the first compensation layer by the body zones, and gate electrodes, each gate electrode capacitively coupled to one of the body zones.

3. The super junction semiconductor device according to claim 2, wherein the body zones are provided in a vertical projection of the compensation trenches.

4. The super junction semiconductor device according to claim 2, wherein the gate electrodes are provided in gate trenches extending from the first surface into the semiconductor mesas.

5. The super junction semiconductor device according to claim 1, wherein the compensation structure comprises an intrinsic layer between the first and second compensation layers.

6. The super junction semiconductor device according to claim 1, further comprising a dielectric liner covering the compensation structure in the compensation trenches, each compensation trench further including an air gap in portions lined by the dielectric liner.

7. The super junction semiconductor device according to claim 1, wherein the first compensation layer of the compensation structure is closer to the semiconductor mesa than the second compensation layer.

8. The super junction semiconductor device according to claim 1, wherein the first section of the super junction structure oriented to the first surface has an excess of impurities of the second conductivity type and the second section oriented to the second surface has an excess of impurities of the first conductivity type.

9. The super junction semiconductor device according to claim 8, wherein the first section extends over at least one-third and at most two-thirds of a vertical extension of the super junction structure, and the second section extends over a remaining section of the super junction structure.

10. The super junction semiconductor device according to claim 8, wherein in the first section, in a vertical extension unit a quantity of impurities of the second conductivity type exceeds a quantity of impurities of the first conductivity type by at least 2%, and in the second section a quantity of impurities of the first conductivity type exceeds a quantity of impurities of the second conductivity type in a vertical extension unit by at least 2%.

11. The super junction semiconductor device according to claim 8, wherein the first section extends over 40% to 60% of a vertical extension of the super junction structure and the second section extends over a remaining portion of the vertical extension of the super junction structure.

12. The super junction semiconductor device according to claim 8, wherein in the first section the second compensation layer contains more impurities of the second conductivity type than in the second section.

* * * * *